(12) United States Patent
Kurisu

(10) Patent No.: US 6,172,543 B1
(45) Date of Patent: Jan. 9, 2001

(54) 90° PHASE SHIFT CIRCUIT

(75) Inventor: Masakazu Kurisu, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/335,503

(22) Filed: Jun. 18, 1999

(30) Foreign Application Priority Data

Jun. 22, 1998 (JP) .................................................. 10-174350

(51) Int. Cl.[7] .................................................. H03H 11/16
(52) U.S. Cl. .......................... 327/255; 327/258; 327/306; 327/558; 327/559
(58) Field of Search .................................. 327/254, 255, 327/258, 306, 558, 559

(56) References Cited

U.S. PATENT DOCUMENTS 5,051,972 * 9/1991 Yamamuro ........................ 369/32

5,608,796 * 3/1997 Banu et al. ......................... 379/403

FOREIGN PATENT DOCUMENTS 3-121610   5/1991 (JP) .

* cited by examiner

*Primary Examiner*—Kenneth B. Wells
*Assistant Examiner*—Cassandra Cox
(74) *Attorney, Agent, or Firm*—McGuireWoods LLP

(57) ABSTRACT

A 90° phase shift circuit receives an input signal to generate a Q-signal and an I-signal having a phase difference of 90° therebetween. The 90° phase shift circuit has a CR-type high-pass filter having a variable capacitor and fixed resistor, a CR-type low-pass filter having a variable capacitor and a fixed resistor, and a level comparator for comparing the amplitudes of both the outputs from the filters to feed-back a control signal for controlling the cut-off frequencies of both the filters.

4 Claims, 6 Drawing Sheets

90° PHASE SHIFT CIRCUIT

BACKGROUND OF THE INVENTION (a) Field of the Invention

The present invention relates to a 90° phase shift circuit and, more particularly, to a 90° phase circuit for generating I-signal and Q-signal having a phase difference of 90° therebetween and suitable for use in a radio communication system.

(b) Description of the Related Art

90° phase shift circuits are generally used in radio communication systems. Referring to FIG. 1, a conventional 90° phase shift circuit includes a high-pass filter (HPF) 12 having therein a serial capacitor (C) an a parallel resistor (R), a low-pass filter 13 having therein a serial resistor (R) and a parallel capacitor (C), a first limiter amplifier 14 for receiving an output from the HPF 12 to deliver a Q-signal, a second limiter amplifier 15 for receiving an output from the LPF 13 to deliver an I-signal.

An input signal having an angular frequency of $\omega$ and supplied through the input terminal 16 common to HPF 12 and LPF 13 leads in phase after passing the HPF 12, and lags in phase after passing the LPF 13. The ratio of an output voltage V1 from the HPF 12 to an output voltage V2 from the LPF 13 is expressed by:

$$V1/V2 = j\omega \cdot C \cdot R.$$

As understood from the above equation, the phase difference between the output voltages V1 and V2 is 90 degrees irrespective of the angular frequency $\omega$.

The practical phase error of the output signals from the HPF 12 and the LPF 13 depends on the relative accuracy between the capacitances (C) and between the resistors (R). In general, if the fabrication techniques used for current semiconductor integrated circuits are applied to the conventional 90° phase shift circuit, a high relative accuracy can be obtained between the resistors and between the capacitors, and accordingly, the phase error can be suppressed to a suitable level.

On the other hand, the amplitudes of the output voltages V1 and V2 coincide with each other at an angular frequency $\omega$ wherein the following equation holds:

$$\omega \cdot C \cdot R = 1.$$

Accordingly, the amplitude error depends on the absolute accuracy of the resistors and the capacitors. Thus, in the conventional 90° phase shift circuit, limiter amplifiers are provided at the outputs of the HPF 12 and the LPF 13 for controlling the amplitude difference between the output voltages V1 and V2 to compensate the absolute errors of the resistors and the capacitors.

However, in the conventional 90° phase shift circuit as described above, since the phases of the outputs from the limiter amplifiers 14 and 15 depend on the respective input amplitudes of the limiter amplifiers 14 and 15, a phase error is generated by the fact that the amplitude error is suppressed by using the limiter amplifiers. That is, the presence of the limiter amplifiers 14 and 15 itself generates a new phase error.

SUMMARY OF THE INVENTION

In view of the above, it is an object of the present invention to provide a 90° phase shift circuit having a higher level of accuracy in phase and amplitude by suppressing the amplitude error without using limiter amplifiers.

The present invention provides a 90° phase shift circuit including: a high-pass filter including a first capacitor connected between an input terminal and a first output terminal and a first resistor connected between the first output terminal and a reference line, the high-pass filter outputting a first signal having a first amplitude and a first phase; a low-pass filter including a second resistor connected between the input terminal and a second output terminal and a second capacitor connected between the second output terminal and the reference line, the low-pass filter outputting a second signal having a second amplitude and a second phase which is 90° behind with respect to the first phase; and a level comparator for comparing the first amplitude against the second amplitude to feed-back a control signal to the high-pass filter and the low-pass filter, the control signal controlling cut-off frequencies of the high-pass filter and the low-pass filter based on a difference between the first amplitude and the second amplitude.

In accordance with the 90° phase shift circuit of the present invention, since the amplitude error can be removed by a feed-back control using a level comparator, the 90° phase shift circuit is free from the new phase error as encountered in the conventional circuit.

The above and other objects, features and advantages of the present invention will be more apparent from the following description, referring to the accompanying drawings.

PREFERRED EMBODIMENTS OF THE INVENTION

Figure 1:
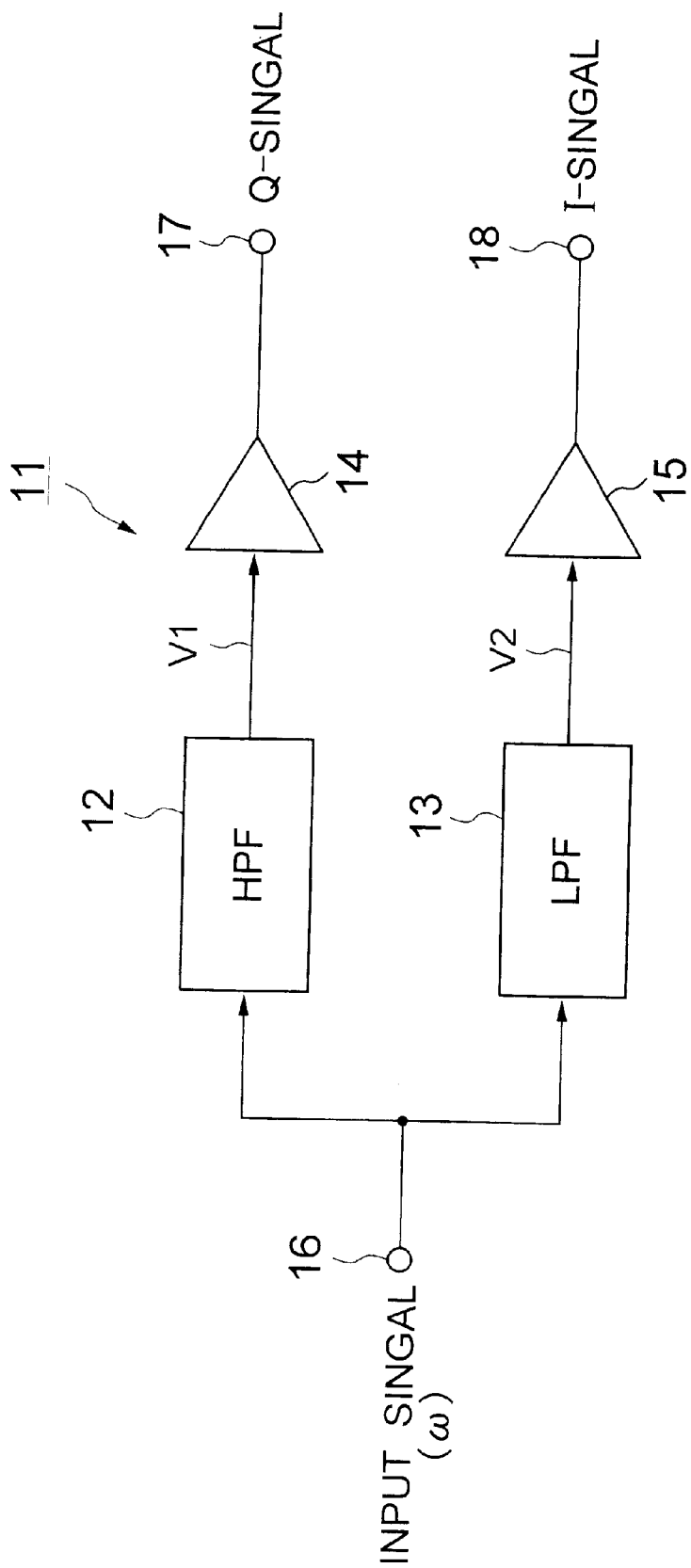
FIG. 1 is a block diagram of a conventional 90° phase shift circuit.

Now, the present invention is more specifically described with reference to accompanying drawings, wherein similar constituent elements are designated by similar reference numerals.

Figure 2:
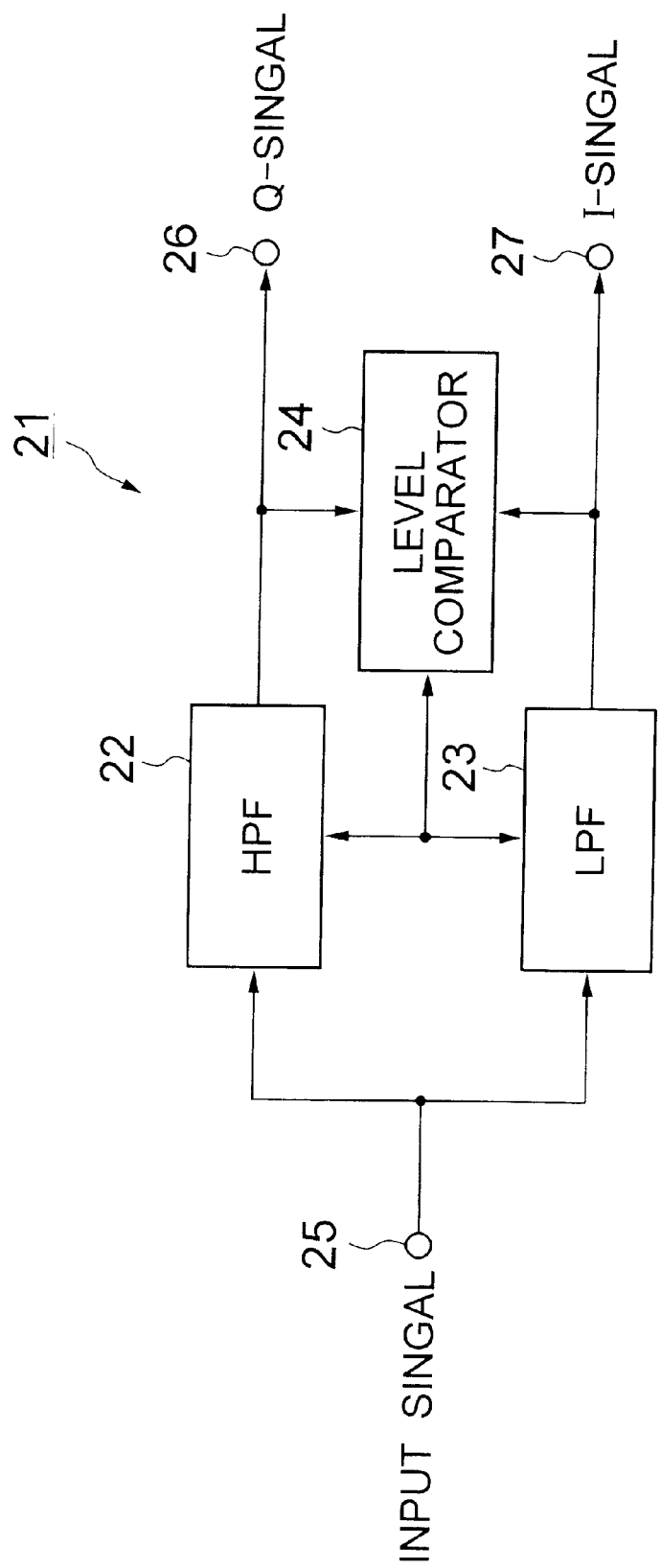
FIG. 2 is a block diagram of a 90° phase shift circuit according to an embodiment of the present invention.

Referring to FIG. 2, a 90° phase shift circuit 21 according to an embodiment of the present invention is of a CR-RC type and includes a CR-type HPF 22 for receiving an input signal through an input terminal 25 to deliver a Q-signal from a first output terminal 26, a RC-type LPF 23 for receiving the input signal through the input terminal 25 to deliver an I-signal from a second output terminal 27, and a level comparator 24 for receiving Q-signal and I-signal to compare the amplitudes of both the signals and to control the cut-off frequencies of the HPF 22 and the LPF 23 by a feed-back control.

Q-signal leads in phase with respect to the input signal and I-signal lags in phase with respect to the input signal. The phase difference between Q-signal and I-signal is at 90 degrees as understood from the following equation:

$$V1/V2 = j\omega \cdot C \cdot R,$$

wherein C and R are capacitance and resistance of the HPF 22 and the LPF 23, and $\omega$ is an angular frequency of the input signal.

If the HPF 22 and the LPF 23 have cut-off frequencies higher than design cut-off frequencies due to variations in the process conditions of the fabrication process, then I-signal has an amplitude higher than the amplitude of Q-signal. On the other hand, if the HPF 22 and the LPF 23 have cut-off frequencies lower than design cut-off frequencies due to variations in the process conditions of the fabrication process, then Q-signal has an amplitude higher than the amplitude of I-signal.

The amplitudes of Q- and I-signals are compared against each other in the level comparator 24, the output of which is fed-back to the HPF 22 and the LPF 23 to control the cut-off frequencies thereof. Specifically, if the amplitude of I-signal is higher than the amplitude of Q-signal, the cut-off frequencies of the HPF 22 and the LPF 23 are lowered. On the other hand, if the amplitude of Q-signal is higher than the amplitude of I-signal, then the cut-off frequencies of the HPF 22 and the LPF 23 are raised. Thus, the amplitudes of both Q- and I-signals are equalized with each other, with the phase difference being maintained at 90° between Q-signal and I-signal, irrespective of variations of process conditions.

Figure 3:
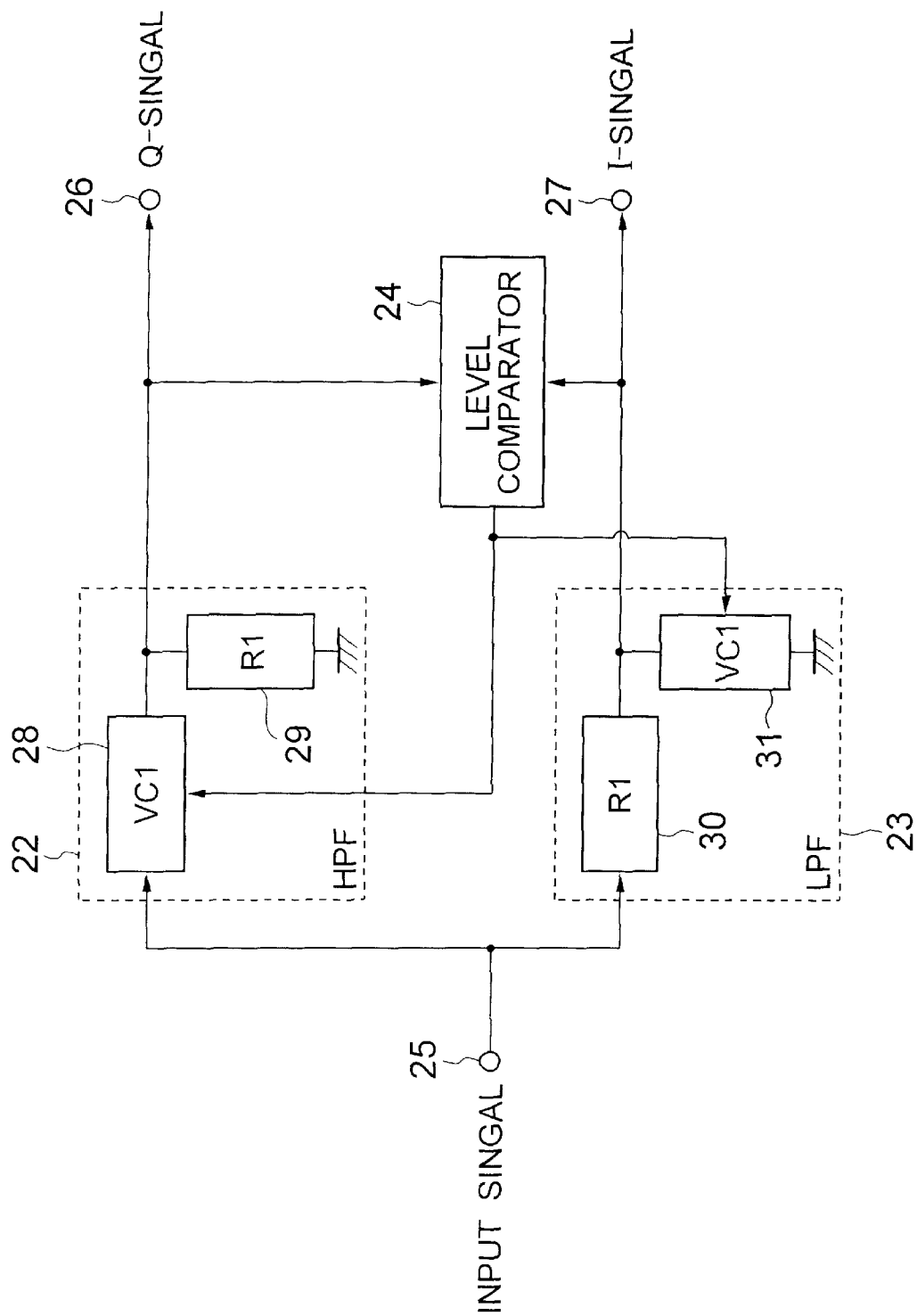
FIG. 3 is a block diagram of a first example of the 90° phase shift circuit of FIG. 2.

Referring to FIG. 3 showing a first practical example of the 90° phase shift circuit of FIG. 2, the HPF 22 is implemented by a variable capacitor 28 having a variable capacitance VC1 and connected between the input terminal 25 and the first output terminal 26 for outputting Q-signal, and a resistor 29 having a fixed resistance R1 and connected between the first output terminal 26 and the ground or reference line. The LPF 23 is implemented by a resistor 30 having a fixed resistance R1 and connected between the input terminal 25 and the second output terminal 27 for outputting I-signal, and a variable capacitor 31 having a variable capacitance VC1 and connected between the second output terminal 27 and the ground.

The variable capacitors 28 and 31 are controlled for the capacitance VC1 thereof by an output signal from the level comparator 24. More specifically, if I-signal has a higher amplitude than Q-signal, the capacitances VC1 of the variable capacitors 28 and 31 are increased for lowering the cut-off frequencies of the HPF 22 and the LPF 23. On the other hand, if Q-signal has a higher amplitude than I-signal, the capacitances VC1 of the variable capacitors 28 and 31 are reduced for raising the cut-off frequencies of the HPF 22 and th LPF 23. The cut-off frequency fc of the HPF 22 and the LPF 23 is generally defined by a formula $fc=1/(2\pi \times R1 \times VC1)$.

Figure 4:
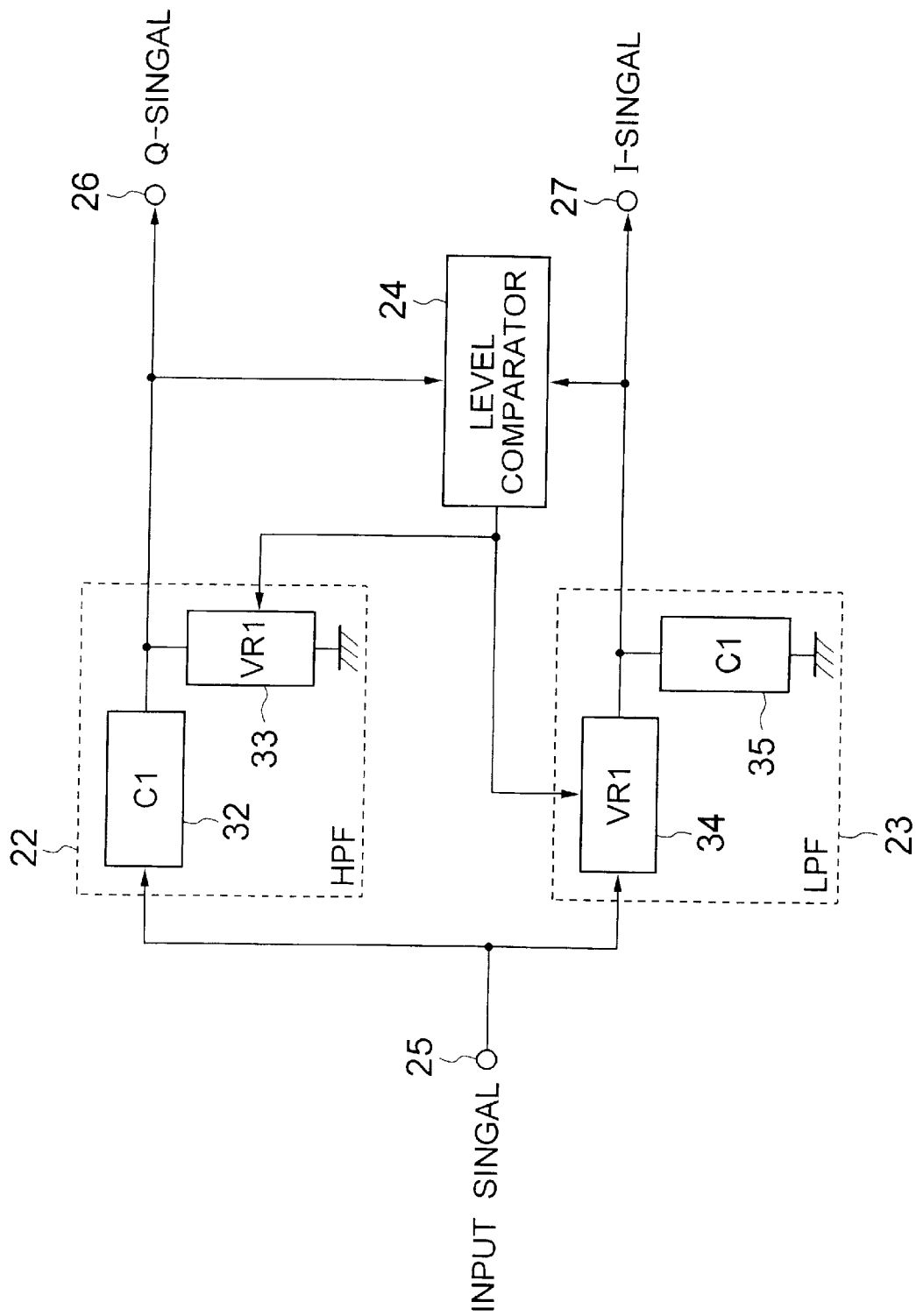
FIG. 4 is a block diagram of a second example of the 90° phase shift circuit of FIG. 2.

Referring to FIG. 4 showing a second example of the 90° phase shift circuit of FIG. 2, the HPF 22 is implemented by a capacitor 32 having a fixed capacitance C1 and connected between the input terminal 25 and the first output terminal 26 for outputting Q-signal, and a variable resistor 33 having a variable resistance VR1 and connected between the first output terminal 26 and the ground. The LPF 23 is implemented by a variable resistor 34 having a variable resistance VR1 and connected between the input terminal 25 and the second output terminal 27 for outputting I-signal, and a capacitor 35 having a fixed capacitance C1 and connected between the second output terminal 27 and the ground.

The variable resistors 33 and 34 are controlled for the resistance VR1 thereof by an output signal from the level comparator 24. More specifically, if I-signal has a higher amplitude than Q-signal, the resistance VR1 of the variable resistors 33 and 34 are increased for lowering the cut-off frequencies of the HPF 22 and the LPF 23. On the other hand, if Q-signal has a higher amplitude than I-signal, the resistance VR1 of the variable resistors 33 and 34 are reduced for raising the cut-off frequencies of the HPF 22 and the LPF 23.

Figure 5:
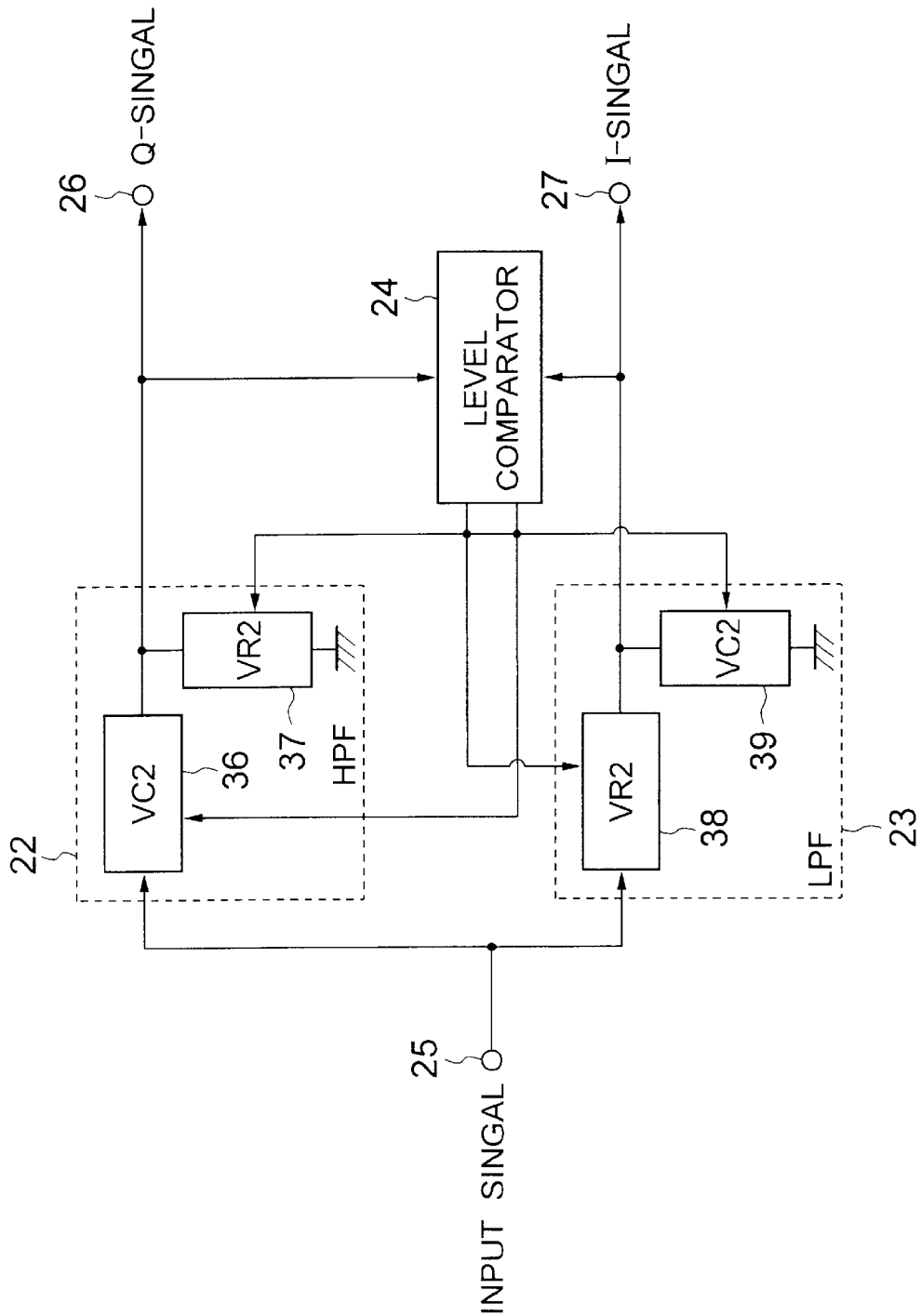
FIG. 5 is a block diagram of a third example of the 90° phase shift circuit of FIG. 2.

Referring to FIG. 5 showing a third example of the 90° phase shift circuit of FIG. 2, the HPF 22 is implemented by a variable capacitor 36 having a variable capacitance VC2 and connected between the input terminal 25 and the first output terminal 26 for outputting Q-signal, and a variable resistor 37 having a variable resistance VR2 and connected between the first output terminal 26 and the ground. The LPF 23 is implemented by a variable resistor 38 having a variable resistance VR2 and connected between the input terminal 25 and the second output terminal 27 for outputting I-signal, and a variable capacitor 39 having a variable capacitance VC2 and connected between the second output terminal 27 and the ground.

The variable resistance VR2 of the variable resistors 37 and 38 and the variable capacitance VC2 of the variable capacitors 36 and 39 are controlled by an output signal from the level comparator 24. More specifically, if I-signal has a higher amplitude than Q-signal, at least one of VC2 and VR2 is increased in both the HPF 22 and the LPF 23 for lowering the cut-off frequencies of the HPF 22 and the LPF 23. On the other hand, if Q-signal has a higher amplitude than I-signal, at least one of VC2 and VR2 is reduced in both the HPF 22 and the LPF 23 for raising the cut-off frequencies of the HPF 22 and the LPF 23. In this example, the cut-off frequencies can be controlled with smaller steps.

In order to implement the variable resistors and the variable capacitors, there are two techniques: an analogue technique wherein a varactor diode or varistor diode, for example, is controlled by an indiscrete control voltage, and a digital technique wherein a discrete capacitance or resistance is provided by switching.

Figure 6:
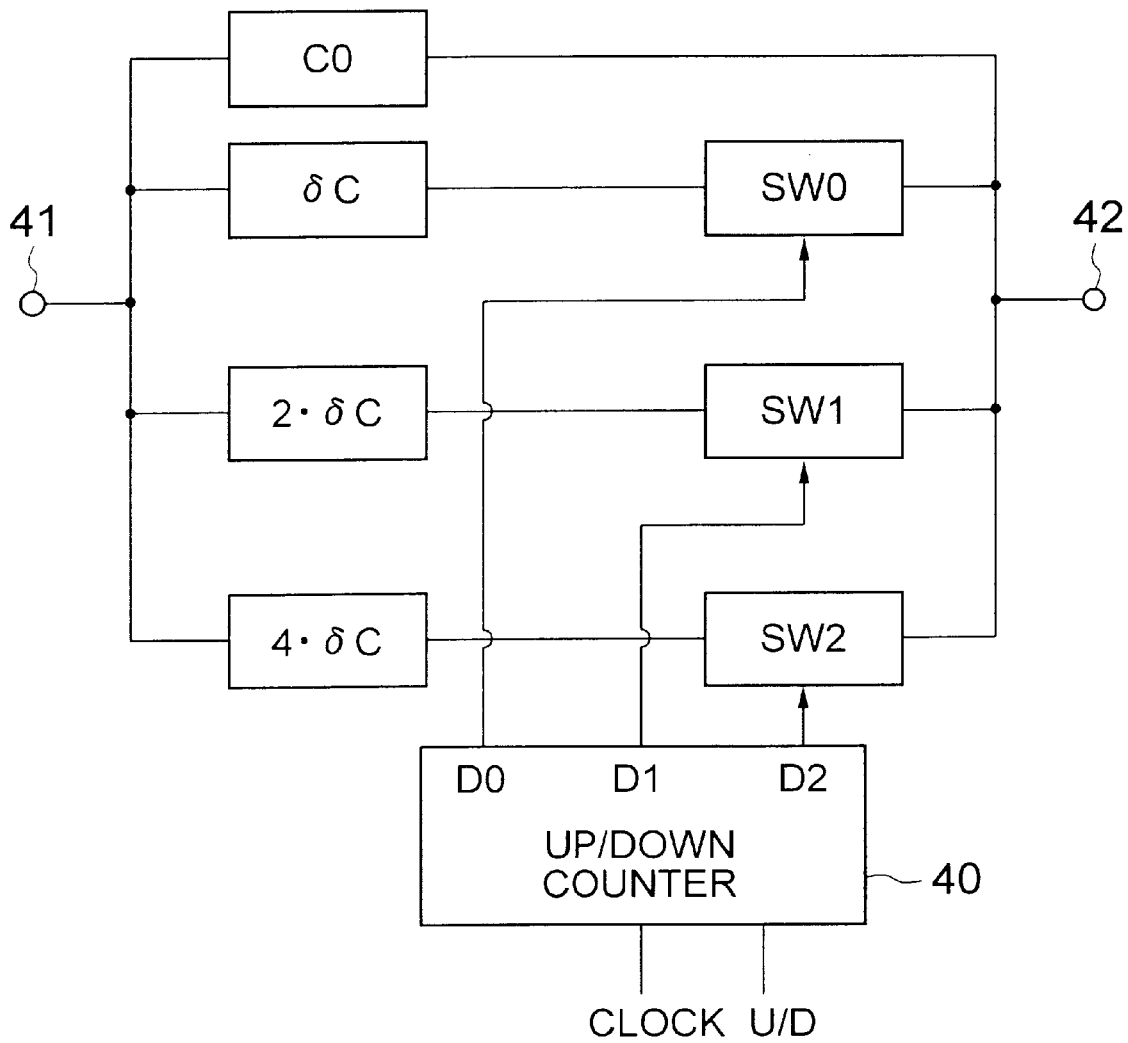
FIG. 6 is practical example of the variable capacitors shown in FIGS. 3 and 5.

FIG. 6 shows an exemplified variable capacitor obtained by the digital technique for providing one of discrete variable capacitances. The variable capacitor includes a fixed main capacitor C0, and a plurality of (three, in this case) additional capacitors having respective capacitances $\delta C$, $2 \cdot \delta C$ and $4 \cdot \delta C$, each of the additional capacitors having a first terminal connected to the input terminal 41. The variable capacitors further includes a plurality of switches SW0, SW1 and SW2 each connected between the second terminal of a corresponding one of the additional capacitors $\delta C$, $2 \cdot \delta C$ and $4 \cdot \delta C$ and the output terminal 42, and a 3-bit up-down counter 40 having a clock input, an up-down control input, and outputs D0, D1 and D2 for controlling the respective switches SW0, SW1 and SW2. The 3-bit up-down counter 40 counts, in up/down directions, clock pulses supplied from the level comparator 24 shown in one of FIGS. 2 to 4, thereby outputting a 3-bit count signal such as (011) or (010).

In operation of the 90° phase shift circuit having the variable capacitors of FIG. 6, the level comparator 24 supplies a clock pulse together with a control signal for specifying up-count or down-count so long as the amplitudes of Q-signal and I-signal have a difference therebetween, which is higher than a threshold value, at each clock pulse of the clock signal. Three switches SW0, SW1 and SW2 are closed or opened based on the respective output bits D0, D1 and D2 of the counter 40. Thus, the variable capacitor of FIG. 6 has a capacitance defined by the output bits of the counter 40, namely, C0, C0+$\delta C$, C0+2$\delta C$, . . . C0+7$\delta C$.

If the difference between the amplitudes of Q-signal and I-signal is below the threshold value, the counter stops counting and remains in a stationary state outputting a 3-bit count signal corresponding to a suitable cut-off frequency. The variable resistors can be also implemented similarly to the variable capacitors. The number of output bits of the up-down counter can be selected for obtaining a desired frequency range and the value for δC can be selected for desired steps of the cut-off frequencies.

Since the above embodiment and examples are described only for examples, the present invention is not limited to the above embodiment or examples and various modifications or alterations can be easily made therefrom by those skilled in the art without departing from the scope of the present invention.

What is claimed is:

1. A 90° phase shift circuit comprising:

a high-pass filter including a first capacitor connected between an input terminal and a first output terminal and a first resistor connected between said first output terminal and a reference line, said high-pass filter outputting a first signal having a first amplitude and a first phase;

a low-pass filter including a second resistor connected between said input terminal and a second output terminal and a second capacitor connected between said second output terminal and said reference line, said low-pass filter outputting a second signal having a second amplitude and a second phase which is 90° behind with respect to said first phase; and a level comparator for comparing said first amplitude against said second amplitude to feed-back a control signal to said high-pass filter and said low-pass filter, said control signal controlling cut-off frequencies of said high-pass filter and said low-pass filter based on a difference between said first amplitude and said second amplitude, wherein said first and second capacitors have a variable capacitance controlled by said control signal, and said first and second resistors have a fixed resistance, and wherein each of said first and second capacitors includes a single fixed capacitor and a plurality of additional capacitors selectively connected in parallel with said fixed capacitor.

2. A 90° phase shift circuit comprising:

a high-pass filter including a first capacitor connected between an input terminal and a first output terminal and a first resistor connected between said first output terminal and a reference line, said high-pass filter outputting a first signal having a first amplitude and a first phase;

a low-pass filter including a second resistor connected between said input terminal and a second output terminal and a second capacitor connected between said second output terminal and said reference line, said low-pass filter outputting a second signal having a second amplitude and a second phase which is 90° behind with respect to said first phase; and a level comparator for comparing said first amplitude against said second amplitude to feed-back a control signal to said high-pass filter and said low-pass filter, said control signal controlling cut-off frequencies of said high-pass filter and said low-pass filter based on a difference between said first amplitude and said second amplitude, wherein said first and second capacitors have a fixed capacitance, and said first and second resistors have a variable resistance controlled by said control signal, and wherein each of said first and second resistors includes a single fixed resistor and a plurality of additional resistors selectively connected in parallel with said fixed resistor.

3. A 90° phase shift circuit comprising:

a high-pass filter including a first capacitor connected between an input terminal and a first output terminal and a first resistor connected between said first output terminal and a reference line, said high-pass filter outputting a first signal having a first amplitude and a first phase;

a low-pass filter including a second resistor connected between said input terminal and a second output terminal and a second capacitor connected between said second output terminal and said reference line, said low-pass filter outputting a second signal having a second amplitude and a second phase which is 90° behind with respect to said first phase; and a level comparator for comparing said first amplitude against said second amplitude to feed-back a control signal to said high-pass filter and said low-pass filter, said control signal controlling cut-off frequencies of said high-pass filter and said low-pass filter based on a difference between said first amplitude and said second amplitude, wherein said first and second capacitors have a variable capacitance, said first and second resistors have a variable resistance, and at least one of said variable capacitance and said variable resistance is controlled by said control signal.

4. The 90° phase shift circuit as defined in claim 3, wherein said each of first and second capacitors includes a single fixed capacitor and a plurality of additional capacitors selectively connected in parallel with said fixed capacitor, and said each of first and second resistors includes a single fixed resistor and a plurality of additional resistors selectively connected in parallel with said fixed resistor.

* * * * *